United States Patent [19]
Markle et al.

[11] Patent Number: 5,557,469
[45] Date of Patent: Sep. 17, 1996

[54] BEAMSPLITTER IN SINGLE FOLD OPTICAL SYSTEM AND OPTICAL VARIABLE MAGNIFICATION METHOD AND SYSTEM

[75] Inventors: David A. Markle, Saratoga; Hwan J. Jeong, Los Altos, both of Calif.

[73] Assignee: Ultratech Stepper, Inc., San Jose, Calif.

[21] Appl. No.: 331,059

[22] Filed: Oct. 28, 1994

[51] Int. Cl.$^6$ ............................ G02B 15/14; G02B 17/00
[52] U.S. Cl. ........................ 359/683; 359/676; 359/727
[58] Field of Search ................................ 359/683, 676, 359/727, 729, 798, 800, 802, 730, 731; 355/43, 55, 67

[56] References Cited

U.S. PATENT DOCUMENTS

| | | | |
|---|---|---|---|
| 4,034,398 | 7/1977 | Sheldrake | 358/60 |
| 4,156,561 | 5/1979 | Lucas | 353/38 |
| 4,171,871 | 10/1979 | Dill | 359/730 |
| 4,391,494 | 1/1984 | Hershel | 359/727 |
| 4,425,037 | 1/1994 | Hershel | 355/43 |
| 4,444,492 | 4/1984 | Lee | 355/55 |
| 4,964,705 | 10/1990 | Markle | 359/727 |
| 5,303,001 | 4/1994 | Jeong | 355/53 |
| 5,329,332 | 7/1994 | Markle | 355/53 |
| 5,402,205 | 3/1995 | Markle | 355/53 |

Primary Examiner—Georgia Y. Epps
Assistant Examiner—Ricky Mack
Attorney, Agent, or Firm—Allston L. Jones

[57] ABSTRACT

An optical system to project an image from an illuminated object to an image plane with a selected magnification factor. This system includes a lens system having a fixed magnification factor and at least one flat plate that is optically compatible with the lens system and which when bent into a cylindrical shape varies the fixed magnification factor of the lens system along one axis of the image. This variable magnification technique is applicable to all lens system types, including a Wynne Dyson type projection system. In addition, a Wynne Dyson optical projection system that includes an optical block in place of the usual fold prism is discussed. The optical block reduces changes in distortion caused by heat transferred from the reticle. The block permits the inclusion of a dichroic beamsplitter diagonally through the optical block which presents minimal attenuation of the exposure illumination. The beamsplitter reflects a portion of the light returning from the image plane to a conjugate focal plane where alignment between the image and the pattern on the substrate can be viewed with a microscope. Illumination projected through the conjugate image plane permits the pattern on the substrate to be viewed directly without interference from the object pattern.

28 Claims, 9 Drawing Sheets

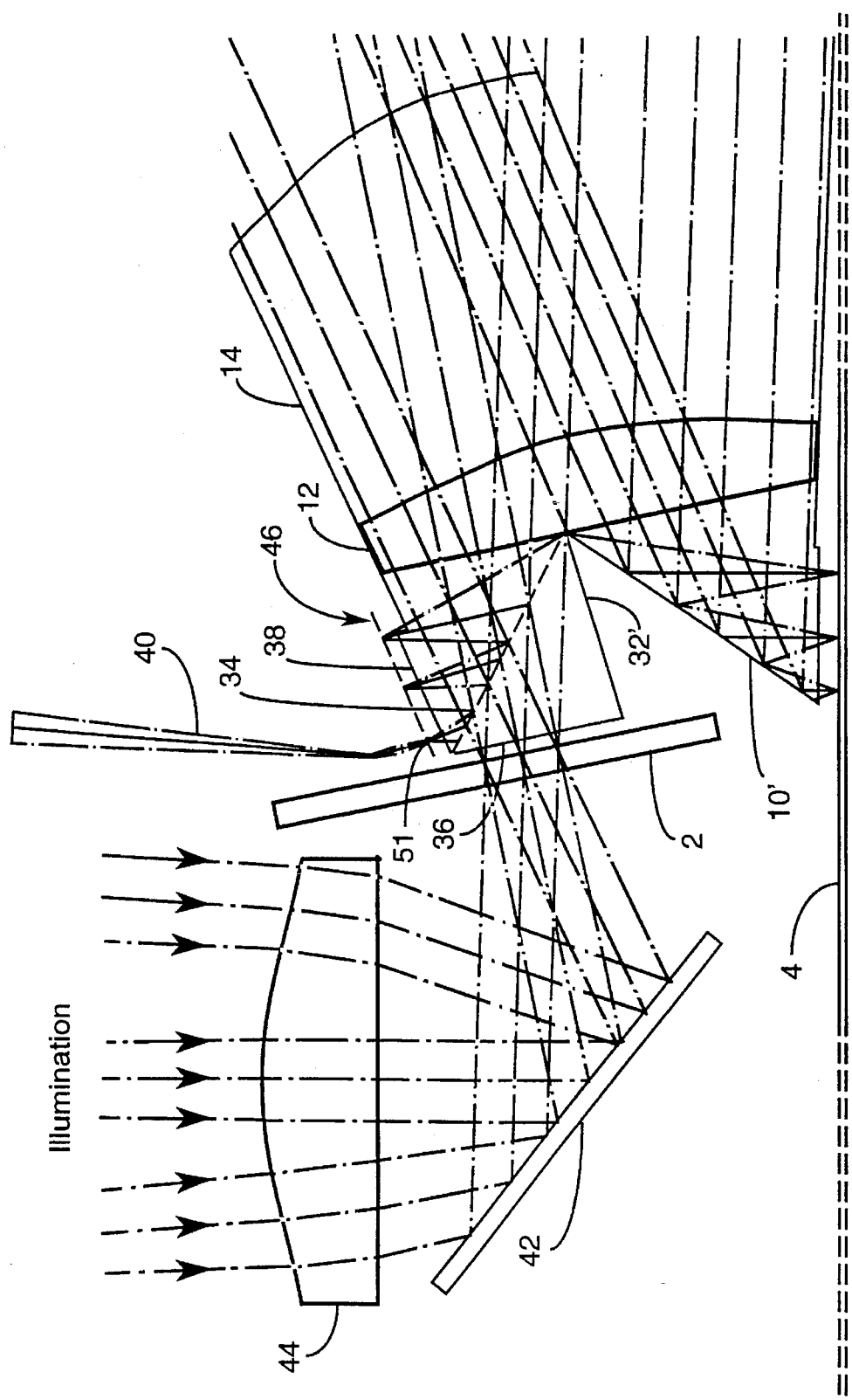

BEAMSPLITTER IN SINGLE FOLD OPTICAL SYSTEM AND OPTICAL VARIABLE MAGNIFICATION METHOD AND SYSTEM

FIELD OF THE INVENTION

The present invention relates to projection optical systems, more particularly to an alternative method and apparatus for selectively and independently varying the magnification and distortion of the optical system in each of the x and y directions, and a single fold optical system which includes a beamsplitter to permit inclusion of an alignment microscope for constant use during the normal operation of the system that is so equipped.

BACKGROUND OF THE INVENTION

In a typical optical system, in simplified terms, there is an object, a lens to focus an image of the object, and an image plane onto which the image of the object is projected from the lens. The magnification of the projected image in such a system may be determined by the spacing of the object from the lens with the lens spaced from the image plane to obtain good focus. In that system, magnification can be changed simply by moving the object relative to the lens to increase or decrease the distance between them.

One application for a projection optical system is in a reduction stepper. Thus, the object is a reticle having a pattern that is to be projected onto a wafer that is located at the image plane. Thus, the magnification of the image from the reticle that is projected onto the wafer can usually be easily changed by merely changing the coordinates between the wafer and the lens, and the reticle and the lens. That is, by simply moving the reticle with respect to the lens and the wafer with respect to the lens in a fixed relationship with respect to each other, the magnification of the image projected onto the wafer is easily changed. Further, the alignment of targets at the edge of a field on the wafer are automatically checked, and if the projected targets from the reticle are not projected to the same scale as those on the wafer, there is a magnification error. Thus, in such a system, the magnification of the projected image from the reticle may be automatically changed before the wafer is exposed. Note, however, that the magnification change in the x and y directions will always remain the same and cannot be altered by different amounts in this optical configuration.

In some optical systems, however, the magnification between the image and the object, or reticle, can not be varied. One such system is a Wynne Dyson optical system that is telecentric on both the reticle side and the wafer side. In such a system, various things can be varied in the lens system, without effecting the magnification ratio. The magnification stays stuck at 1.000000 . . . to less than a part per million.

The need for the ability to make small adjustments in the magnification in all stepper systems is caused by substantially the same reasons. Namely, through the processing of a wafer, multiple layers of different materials each patterned with a different reticle pattern are laid-down on the wafer. Thus, the wafer has an initial scale when it receives the first layer, and as each layer is added to the wafer, the wafer goes into either tension or compression with the addition of each layer, so that with each step of the process the wafer changes scale by a few parts per million (ppm). Perhaps as much as 10 ppm in an extreme case. To aggravate the problem even more, it is highly probable that each change in scale of the wafer can be, and usually is, slightly different in the x direction than it is in the y direction.

As a result of the scale changes from the previous layers, the next pattern from the reticle may not fit very well over the previous patterns. Thus, there may be a size or magnification mismatch of the reticle pattern when projected onto the wafer.

In all types of stepper systems, and in optical systems in general, there are many other things that can cause a magnification change. For example, a reticle is generally made of fused-silica that expands and contracts very little with changes in temperature, however, a semiconductor wafer has a relatively high coefficient of expansion with changes in temperature. Since the wafer and reticles are not necessarily at the same temperature each time they are placed in the stepper, the expansion of the wafer can become critical, even if the temperature change is only 1° C., plus or minus. For example, a typical wafer will undergo approximately a 2.4 ppm change in scale for a temperature change of 1° C.

Additionally, when a lens is built, its parts are never made perfectly, or identically each time, which can result in distortion. Thus, in a stepper system the reticle pattern that reaches the wafer is not exactly the same as the original pattern—it is distorted in some way. A common form of that distortion is that the magnification may not be exactly the same in the x and y directions. For example, the magnification could be a few ppm greater in the x direction and a few ppm less in the y direction, or some other variation between the two directions.

In the telecentric Wynne Dyson optical system employed in Ultratech Stepper, Inc., stepper systems, there could be a cylindrical shape built into the internally reflecting surfaces in the fold prisms since it is impossible to make a perfectly flat surface. This will generate a magnification error which cannot be easily corrected.

Thus it can be seen that in all optical systems, whether it is a stepper projection system or some other system, there are likely to be inherent magnification errors that may not be easily compensated for in the prior art. Correction techniques and devices suitable for unscanned, full field projection systems usually make the same correction in both the x and the y direction, regardless of whether there may be more correction needed in one direction than in the other.

There are other prior art 1:1 magnification systems, for example scanners where initially there was no provision to compensate for magnification changes. The errors were simply lived with, as they have been with the telecentric Wynne Dyson type optical stepper systems. However, as the size of wafers grew bigger and the reticle patterns became finer, a built-in technique was devised for the Micralign Models 500 and 600 generation of scanners to vary the magnification to compensate for magnification error. In Micralign scanners the magnification is changed by performing two different operations. In a scanner, the illumination on a wafer is constrained to a narrow slit spanning the width of the wafer. To change the magnification in the along the slit direction, a pair of optical shells near the intermediate image plane, can be moved resulting in a variation the magnification in the along the slit direction. And then to change the magnification in the scanning direction, the cross slit direction, the reticle can be gradually moved with respect to the wafer as the wafer moves across the slit. That is, as successive parts are copied, the reticle is continuously advanced with respect to the wafer resulting in a change in magnification in the cross slit direction. This technique for scanners, however, is not applicable to a full field telecentric Wynne Dyson type optical stepper system because: a) scanning is not performed; b) there are no shells in the optical path that could be moved to vary the magnification in either direction; and c) imagery is done simultaneously over the whole field and not in a small localized region defined by a slit illuminator.

In most reduction stepper systems it is clear that magnification can be varied, by simply moving the reticle relative to the lens, and then refocusing the image on the wafer since most reduction steppers are not telecentric on the reticle side. However, this method results in the same amount of magnification variation in both the x and y directions. Since the scale of a wafer is likely to change slightly differently in the x direction than in the y direction, this is not an ideal solution.

Further, in known Wynne Dyson type optical projection systems it is only practical to view the alignment between the image and the pattern on the substrate by looking through the reticle when the reticle is not being illuminated with exposure radiation.

It would be desirable to have a system that permits the adjustment of the magnification of a lens system for small variations of magnification that result from various factors (e.g. variations in the temperature of the substrate, errors in the sphericity of optical surfaces within the system, etc.). The ability to modify the magnification factor along one axis of the final image, independently of the magnification factor for the orthogonal axis, would also be useful. Further, the ability to make magnification adjustments would be particularly useful in Wynne Dyson type optical systems where the magnification factor is 1:1 and not otherwise variable. Additionally, in a Wynne Dyson type optical system it would be useful to be able to view the image on a substrate at the image plane at any time, with or without the image of the reticle superimposed thereon. All of these improvements are provided by the present invention as will be seen from the following discussion and reference to the figures.

SUMMARY OF THE INVENTION

In accordance with the preferred embodiments of the present invention, the present invention is directed to an optical system to project an image from an illuminated object to an image plane with a selected magnification or distortion. This optical system includes a lens system having a fixed magnification and distortion with at least one flat plate that is optically compatible with the lens system which when deformed adds a variable magnification or distortion to the fixed magnification and distortion of the lens system. This variable magnification and distortion technique is applicable to all lens system types, including a Wynne Dyson type projection system.

In addition, the present invention includes a Wynne Dyson optical projection system that includes an optical block in place of the usual fold prism associated with the illuminated object at the object plane. The optical block provides a flat surface adjacent the object plane to project the image of the object to an image plane adjacent a fold prism at the output side of the system, and another flat surface that intersects the surface adjacent the object plane. The inclusion of the optical block minimizes the temperature gradient that occurred across the flat surface adjacent the object plane in the previously used input fold prism at that location. Also, the optical block permits the inclusion of a beamsplitter diagonally through the optical block with a coating that presents minimal attenuation of the image beam being transmitted to the image plane in the ultraviolet, while also reflecting a portion of the visible image beam returning from the image plane to the intersecting surface, or conjugate image plane, of the optical block. A microscope may also be placed adjacent the intersecting surface of the optical block to permit a user to view the image in the image plane at the intersecting surface. At the image there is a superposition of the object at the object plane and of the image on the substrate, or wafer, at the image plane. Further, the illumination of the intersecting surface, without illumination being applied to the object, permits a user to illuminate and view the substrate, or wafer, at the image plane without a superimposed image of the object, or reticle.

BRIEF DESCRIPTION OF THE FIGURES

FIG. 7 is a further modified Wynne-Dyson type optical stepper projection system of the present invention.

FIG. 9b is a representation of a rectangular image after having passed through a flat plate (solid line) and a twisted plate (broken line) of FIG. 9a.

DESCRIPTION OF THE PREFERRED EMBODIMENT

To better understand the present invention, the figures that illustrate the prior art will first be addressed.

Figure 1:
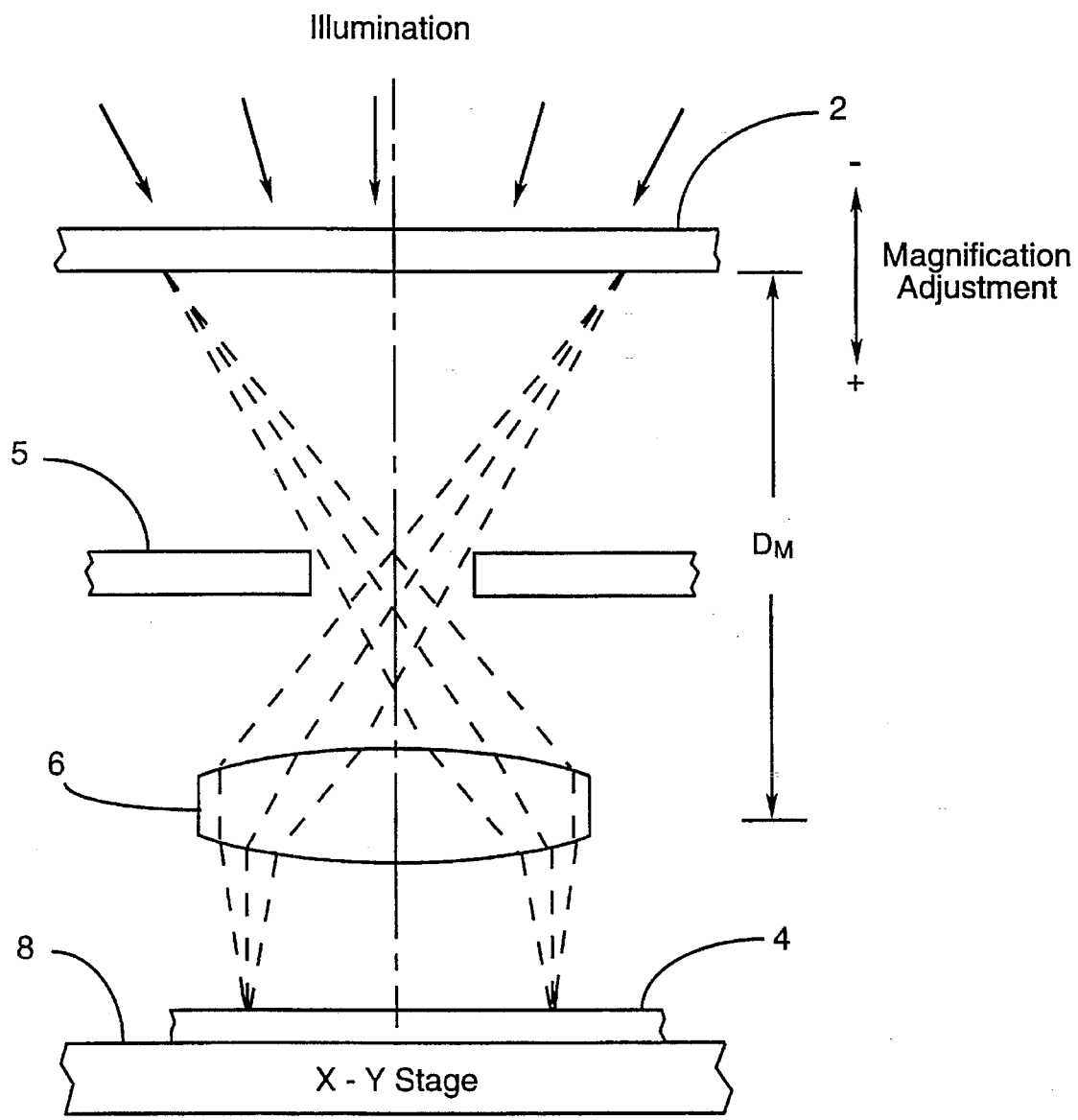
FIG. 1 is a simplified schematic representation of an optical reduction stepper projection system of the prior art.

FIG. 1 is included to illustrate a simple optical system, such as that used in reduction steppers (light rays shown as broken lines). In FIG. 1 incident light is shown impinging on one surface of reticle 2 which has a selected pattern thereon which is to be projected through the optical system. As a result of the pattern on reticle 2, the incident light passes only through those areas of reticle 2 that have a clear portion of the pattern. That transmitted light passes through the center hole of stop 5 and is then applied to lens 6 through which it passes, to form an image of the pattern on reticle 2 onto the top surface of wafer 4 that is mounted on x-y stage 8.

In that configuration, if distance $D_M$ between reticle 2 and lens 6 is increased, the size of the projected pattern image on wafer 4 decreases in size. Similarly, if distance $D_M$ between reticle 2 and lens 6 is decreased, the size of the projected pattern image on wafer 4 increases in size. With either of these changes, it may also be necessary to refocus the image on wafer 4 by varying the distance between wafer 4 and lens 6.

Figure 2:
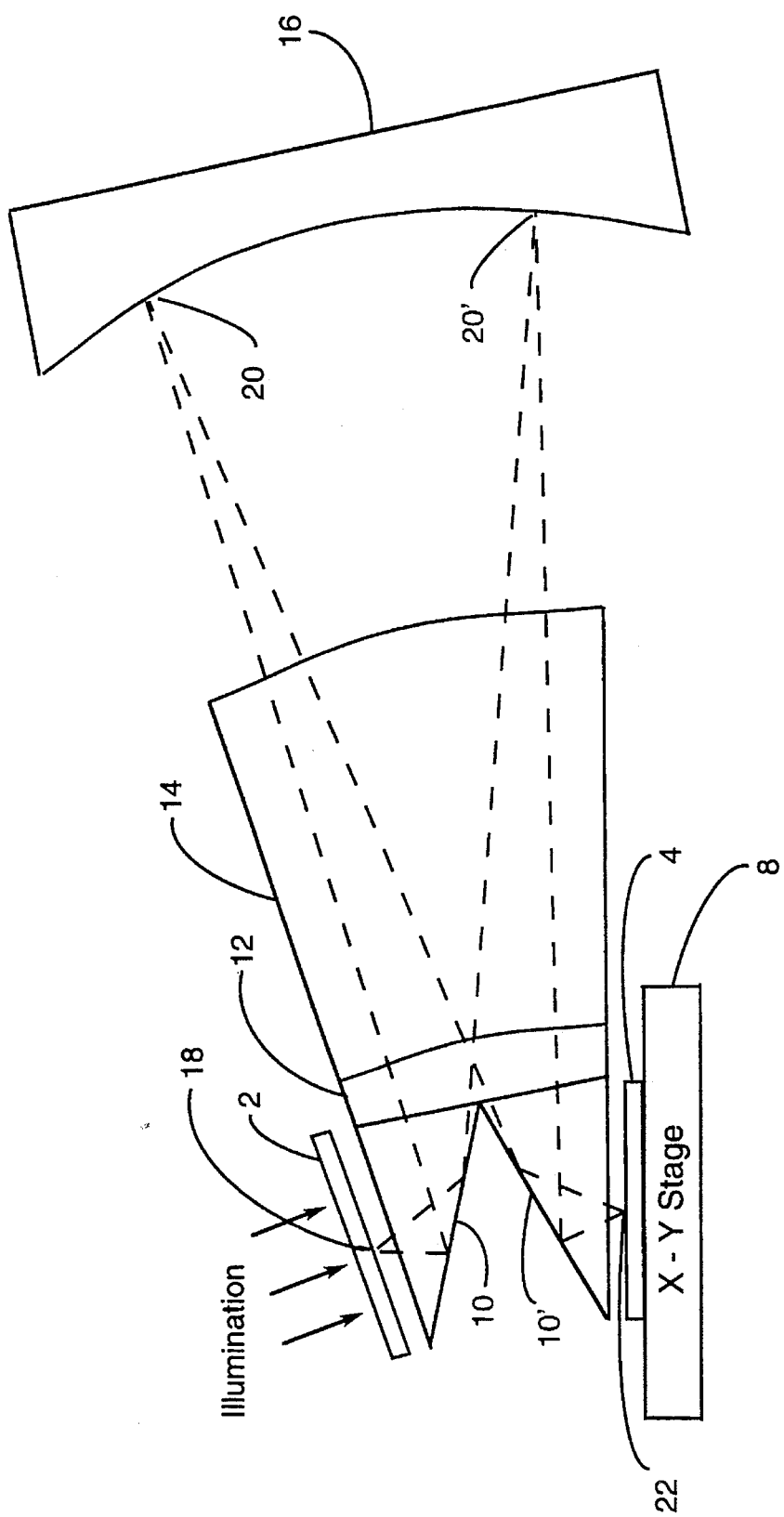
FIG. 2 is a simplified schematic representation of a telecentric, 1:1 magnification Wynne Dyson type optical stepper projection system of the prior art.

Similarly, FIG. 2 (light rays shown as broken lines) illustrates a telecentric, 1:1 magnification, Wynne Dyson type, optical stepper projection system of the prior art where the magnification between the object and the image can not be varied. In this system illumination is directed to one side of reticle 2 that has a selected pattern thereon. A portion of the illumination, as in FIG. 1, passes through reticle 2 and impinges upon the proximate side of, and enters, a first fold prism 10 and reflects off of the distal side thereof. That reflected light passes first through plano lens 12 and then meniscus lens 14. From meniscus lens 14 the light continues to mirror 16 which has a reflective spherical surface that reflects the light (everywhere between points 20 and 20') back through meniscus lens 14, then plano lens 12 and into a second fold prism 10'. Within the second fold prism 10', the light beam is reflected by the distal surface to the proximate surface and therethrough to the surface of wafer 4 which is mounted on x-y stage 8. Thus, since the lens system is symmetric, there is unity magnification between the pattern on reticle 2 and the image on wafer 4.

Figure 3A:
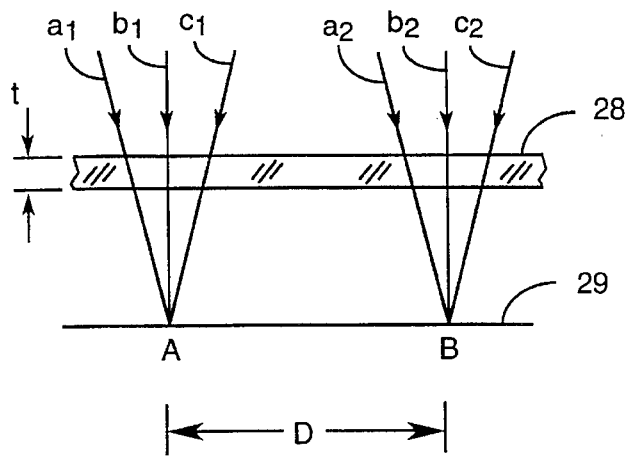
FIGS. 3a–c are simplified schematic representations of one aspect of the present invention that permits magnification correction by bending a thin glass plate.
Figure 3B:
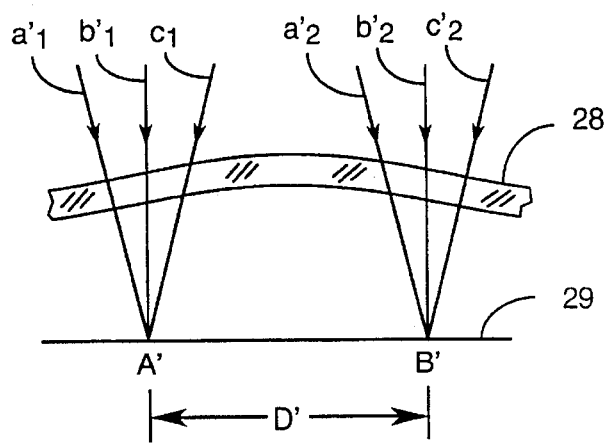
Figure 3C:
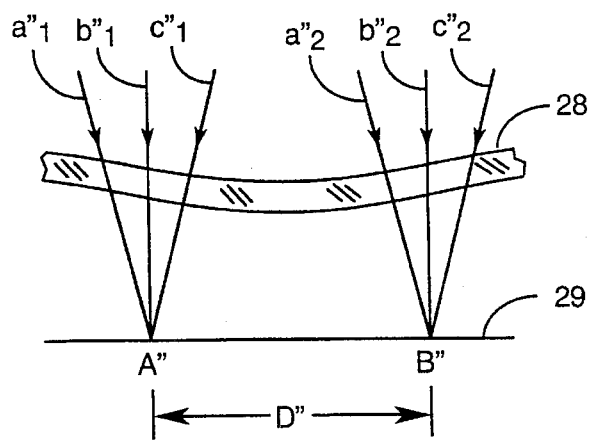

The basic theory of one feature of the present invention is illustrated in companion FIGS. 3a, 3b and 3c. In FIG. 3a there is shown a clear glass plate 28 that is flat on both sides. Here light rays $a_1$, $b_1$ and $c_1$ are shown passing through plate 28 to point A on surface 29. Similarly, light rays $a_2$, $b_2$ and $c_2$ are shown passing through plate 28 to point B on surface 29, with the distance between points A and B noted as D.

In FIG. 3b, plate 28 is shown having been bent to present a convex surface to light rays $a_1'$, $b_1'$ and $c_1'$, and to light rays $a_2'$, $b_2'$ and $c_2'$. As a result of the bending of the plate 28, the path of the light rays in glass plate 28 is shifted slightly so that the resultant image points A' and B' respectively, on surface 29 are spaced-apart from each other by distance D', with D' being less than D of FIG. 3a.

Similarly, in FIG. 3c, plate 28 is shown having been bent to present a concave surface to light rays $a_1''$, $b_1''$ and $c_1''$, and light rays $a_2''$, $b_2''$ and $c_2''$. This causes a shift in the path within plate 28 in the opposite direction to that in FIG. 3b. Consequently, the resultant points of illumination, A" and B", respectively, on surface 29 are spaced-apart from each other by distance D", with D" being greater than D.

Therefore, if the configuration as shown in FIG. 3a is considered the zero magnification reference, then the configuration of FIG. 3b is the negative magnification configuration, and the configuration of FIG. 3c is the positive magnification configuration. In either the positive or negative magnification directions the magnification change is inversely proportional to the radius of the bend.

Generally speaking the type of glass used in the thin bendable plate is not critical, since the optical design can usually be modified to accommodate any type of glass. However, it is anticipated that either fused silica, which is a very hard glass that is easy to polish flat, or BK-7, which is widely used by the industry as a general purpose glass, could be used. The plate thickness chosen in most applications would be quite small and these glass types are widely available and relatively inexpensive. Another choice of glass for the stepper application could be the same as that of the prism or lens that the glass will be adjacent to. Thus, even in critical applications such as when the magnification adjustment plates are used in a high numerical aperture (NA) Wynne Dyson type projection optical system, the addition of the thin plates is easily accommodated with a slight optical redesign, and the type of glass could be any of those with suitable transmission. This literally includes scores of different types of glass.

Thin plates can be applied to the Wynne Dyson type optical system, which is a diffraction limited optical system wherein it is desirable for diffraction to be the only limitation on how small an image can be formed. In such a system, aberrations and imperfections in the optical elements can not be a significant contributor to the size of the image. Therefore the random plate thickness variations over the area spanned by a light beam from a point in the image will probably be limited to a fraction of a wavelength.

From computer simulations of the magnification adjustment provided by thin plates, it has been confirmed that the change in magnification, $\Delta M$, is closely approximated by the following formula:

$$\Delta M = \frac{nt - t}{nR} \quad (1)$$

where,
t=thickness of the plate;
n=index of refraction of the glass of the plate; and
R=radius of curvature of the bent plate.

Figure 3D:
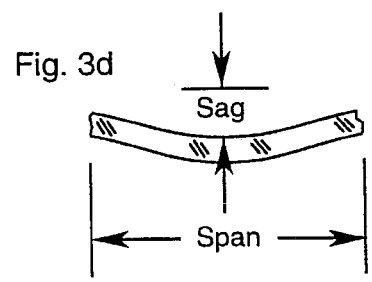
FIG. 3d is a schematic representation of the magnification adjustment plate of the present invention in an exaggerated bent configuration to illustrate the meaning of the terms sag and span of the plate.

Thus for a 10 ppm change in magnification using a 1 mm thick plate having an index of refraction of 1.5 the necessary radius will be approximately 33,300 mm, using equation 1 above. Converting that radius to a term that is more easily visualizable, R=33,300 mm is equivalent to a sag of 13.5 μm for a plate having a span of 60 mm (see FIG. 3d for a visual identification of the terms sag and span). Therefore it can be seen that plate thickness and amount of bending necessary to achieve the desired magnification variation of 10 ppm, or less, is very small and that the space between reticle 2 and prism 10, and wafer 4 and prism 10', can easily accommodate the required amount of sag of the plates.

Figure 4:
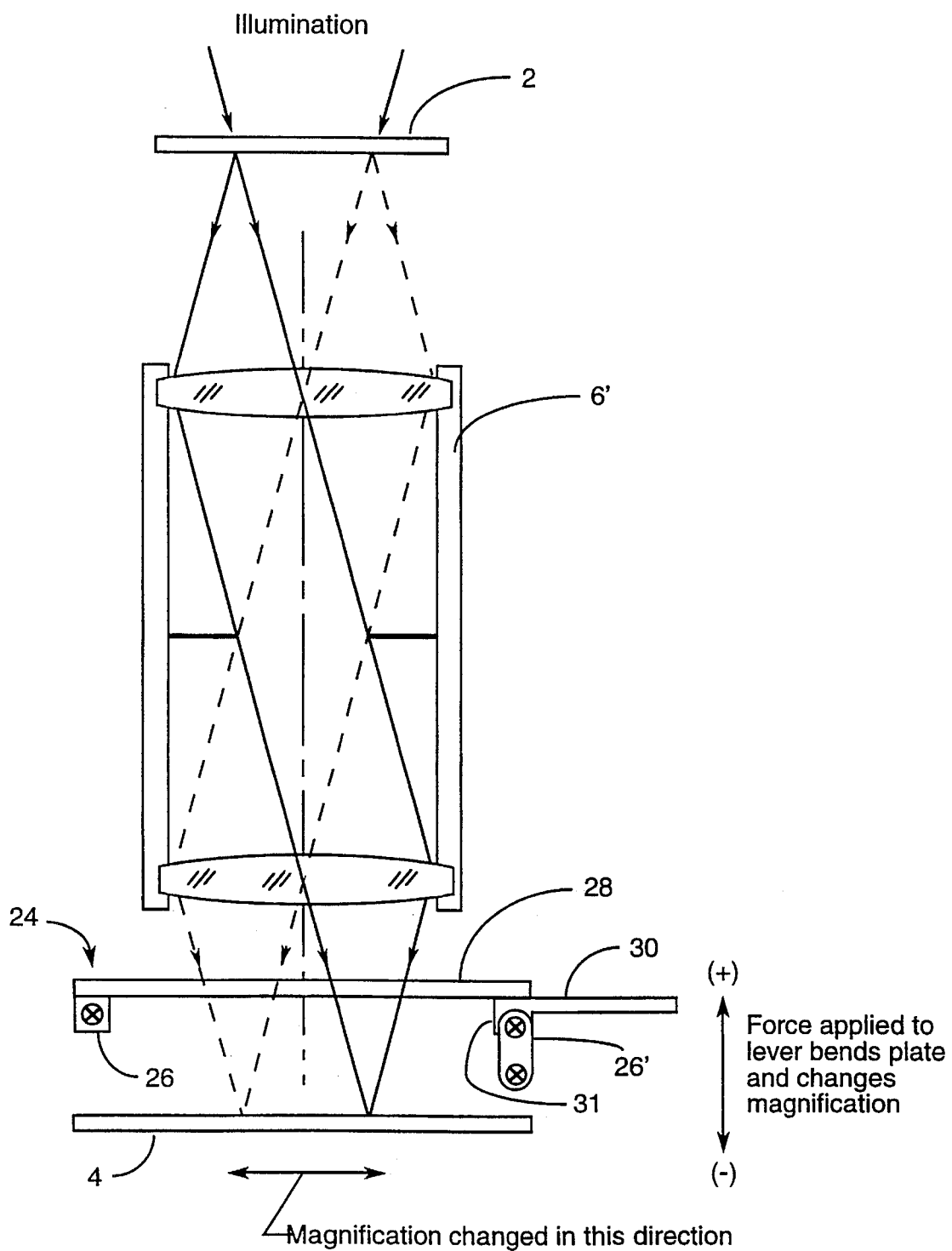
FIG. 4 is a simplified schematic representation of a telecentric lens system incorporating a thin glass plate for magnification adjustment as in the present invention.

Referring next to FIG. 4, there is shown an optical column, similar to that of FIG. 1 with single lens 6 of FIG. 1 replaced with a lens assembly 6' telecentric on both object and image sides and the bendable focusing glass plate assembly 24 of the present invention between lens assembly 6' and wafer 4. In this simplified implementation, glass plate assembly 24 includes glass plate 28 having hardware attached to opposite ends thereof to mount plate 28 between pivot points 26 and 31. Additionally, there is an activation lever 30 extending outward from pivot point 31 to facilitate the bending of glass plate 28 to change the magnification of the system as discussed in relation to FIGS. 3a"c. In the simplest configuration, glass plate 28 need only be mounted to the lens system at one point, cantilever style. However, if this is done, the image on image plane 4 will experience both changes in magnification and a position shift at the center of the field.

Figure 5:
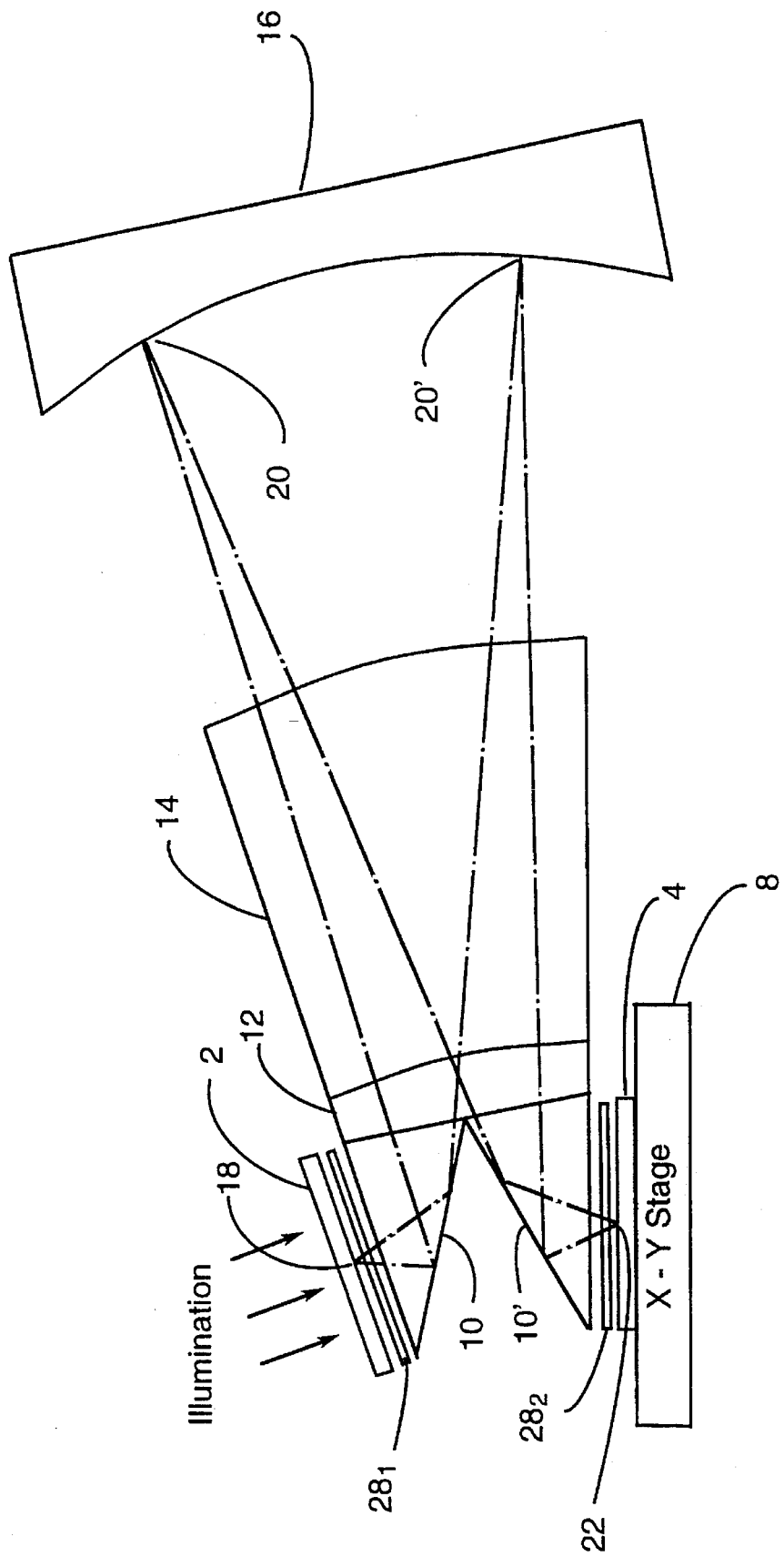
FIG. 5 is a simplified schematic representation of a telecentric, 1:1 magnification Wynne Dyson type optical stepper projection system incorporating two thin glass plates of the present invention to individually adjust the magnification in the x and y directions.

One of the features of the present invention is to provide the ability to vary the magnification in a telecentric Wynne Dyson type optical stepper projection system over a range in excess of ±10 ppm. As stated above, that type of optical system has a fixed magnification of 1:1 which could not previously be changed. FIG. 5 illustrates how the present invention modifies the Wynne Dyson type optical system of FIG. 2 to provide the ability to vary the magnification of the image projected onto wafer 4, in the x and y directions, independently.

Referring to FIG. 5 it will be recognized as being the same view of the Wynne Dyson type optical system as in FIG. 2 with only two changes, namely the addition of thin bendable glass plates $28_1$ and $28_2$. Plate $28_1$ is shown between reticle 2 and the proximate face of fold prism 10, and plate $28_2$ is shown between wafer 4 and the proximate face of fold prism 10'. Thus, in this configuration plates $28_1$ and $28_2$ could be mounted so that they are bendable in directions that are orthogonal to each other (i.e. one perpendicular to the plane of FIG. 5 and the other in the plane of FIG. 5) to enable the adjustment of the magnification of the system in each of the x and y directions, independently. Thus, to correct for any scale changes in wafer 4 or for any distortion that may be present in the optical system itself (e.g. one of the surfaces of one of prisms 10 or 10' may have a surface that is very slightly cylindrical in the x or y direction) then the bending of one or both plates $28_1$ and $28_2$ will enable a correction for the magnification effect of that surface on the overall system. Additionally, so that the design and performance of the optical system are impacted as little as possible, the equivalent thickness of prisms 10 and 10' could be modified so that the addition of thin plates $28_1$ and $28_2$ for magnification control does not change the overall glass path thickness. This could be done by removing a layer of material from the proximate faces of each prism that is as thick as the corresponding one of plates $28_1$ and $28_2$ that is adjacent thereto. Thus, by so modifying the size of prisms 10 and 10' the length of the light path through glass remains substantially equal in each half of the optical system.

Thus, with the present invention the magnification can be independently selected and changed in the x and the y directions as defined by x-y stage 8. Further, magnification imperfections built into such a lens system can be removed, and any scale changes between reticle 2 and wafer 4 are also removable by the little adjustments that can be built into the lens system with plates $28_1$ and $28_2$.

Generally, a substantial amount of illumination energy must be incident on the reticle in order to obtain a high throughput measured in wafers per hour. If reticle 2 contains a high proportion of opaque areas, as it must for some layers, then substantial energy will be absorbed in reticle 2 consequently raising its temperature in the immediate vicinity of the pattern. Consequently, some of the energy absorbed by reticle 2 is radiated and conducted to the surrounding lens system components, including prism 10. This generates temperature gradients in prism 10 that result in shape distortions, and warping, of the reflective face of prism 10 resulting in one dimensional magnification changes and other image distortions.

Figure 6:
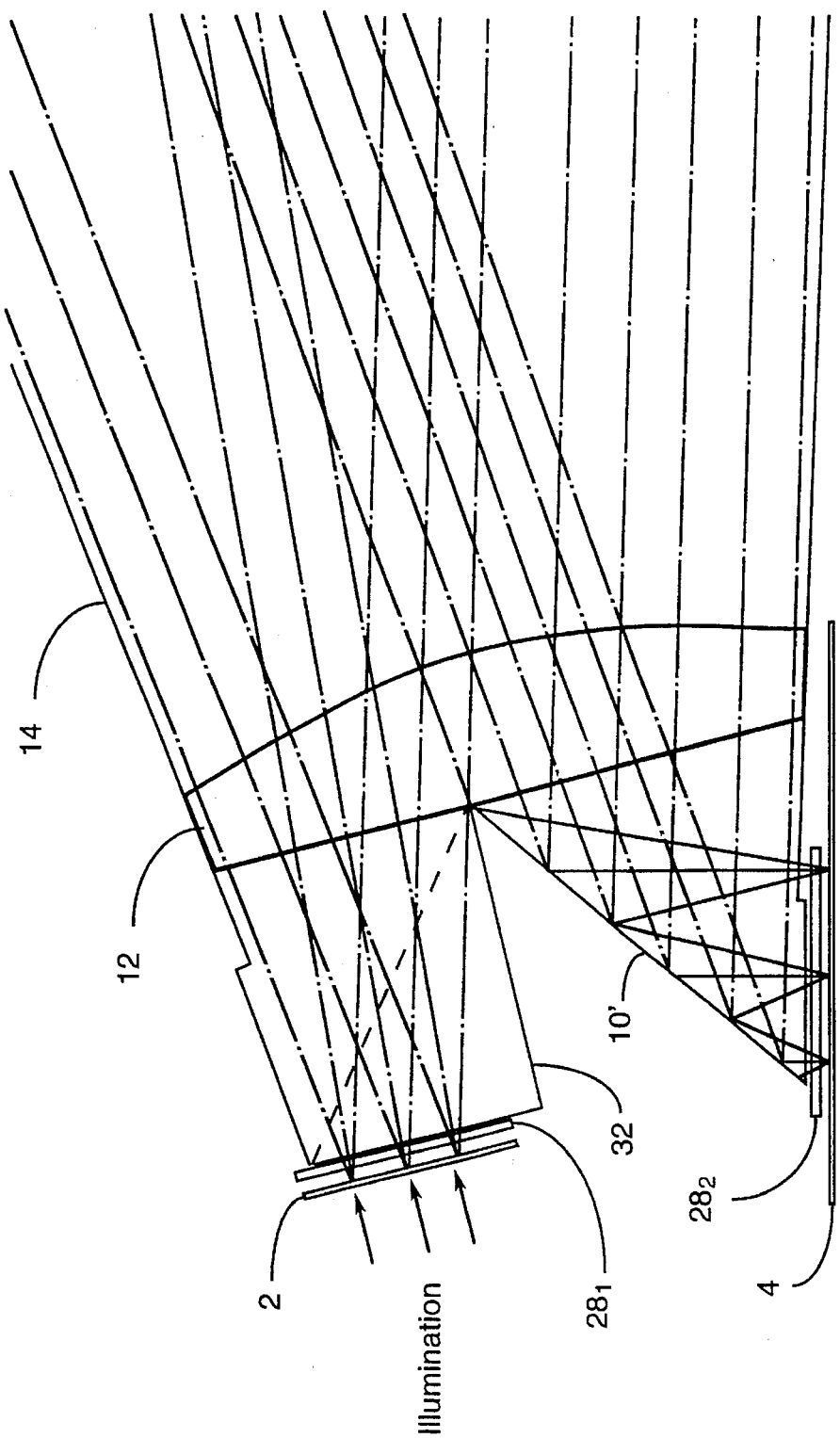
FIG. 6 is a modified Wynne-Dyson type optical stepper projection system of the present invention.

As shown in FIG. 6, to minimize the undesirable effects of this condition, another feature of the present invention includes replacing fold prism 10 of FIG. 5 with glass block 32, and the relocation of reticle 2 adjacent to the face (36) of block 32 that is substantially parallel to the flat face of plano lens 12 (i.e., the face (35) of glass block 32 adjacent the flat face of the plano lens 12 is also parallel to the face of glass block 32 that reticle 2 is adjacent). In this configuration the thermal conductivity from the face of block 32, adjacent reticle 2, into the body of block 32 is higher and the resultant temperature gradients within block 32 are correspondingly lower than when fold prism 10 is used. Furthermore, because the reflection is eliminated with this configuration, the distortion produced by a given temperature gradient is substantially less. Consequently the thermal induced distortion changes are also less. Additionally, the manufacturing errors that occur at the hypotenuse or reflective surface of fold prism 10 which are 6 times more effective in creating distortion errors than equivalent errors in a refractive surface are virtually eliminated. Also shown in FIG. 6 are magnification adjustment plates $28_1$ and $28_2$. However, each of the embodiments of the present invention shown here present advantages to the operation of the optical system that could be employed independently of each other, while the combined advantages present an improved system that is the sum of the advantages of each of the inventions discussed to this point.

Figure 8A:
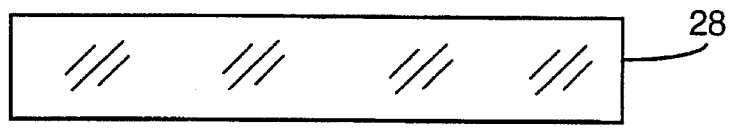
FIG. 8a is a top view of a magnification variation plate of the present invention.
Figure 8B:
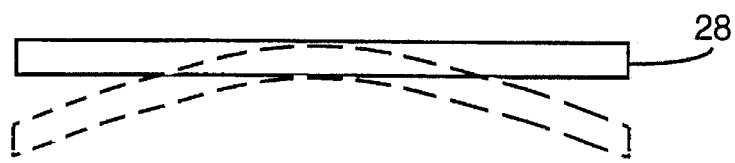
FIG. 8b is a side view of a magnification variation plate of the present invention in the flat configuration (solid lines) and a bent configuration (broken lines).
Figure 8C:
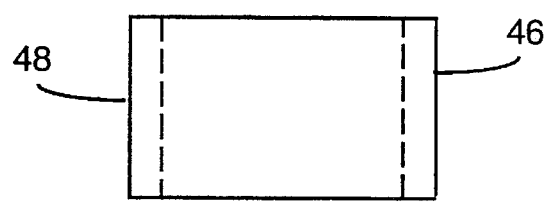
FIG. 8c is a representation of a rectangular image that has passed through the plate in FIG. 8b (solid line—plate in solid line configuration; broken line—plate in broken line configuration).

Referring now to FIGS. 8a–8c there is a simplified representation of the magnification variation effect produced by bending a glass plate that is located within the optical path. In FIG. 8a there is a top view of glass plate 28, and in FIG. 8b there is a side view of that glass plate 28 in an unbent (solid lines) and a bent (broken lines) configuration. Then in FIG. 8c there are two images that have been transmitted through the unbent and bent plate 28 as shown in FIG. 8b. Here, the rectangular image 46 that is projected through the unbent plate is shown in solid lines, and the rectangular image 48 that is projected through the bent plate is shown in broken lines with image 48 being smaller in one direction than image 46 as a result of the direction in which plate 28 is bent.

Figure 9A:
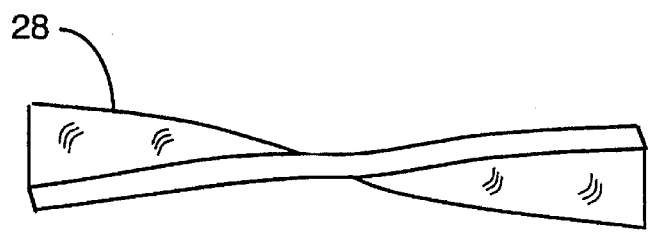
FIG. 9a is a side view of a skew distortion plate shown in a twisted configuration.
Figure 9B:
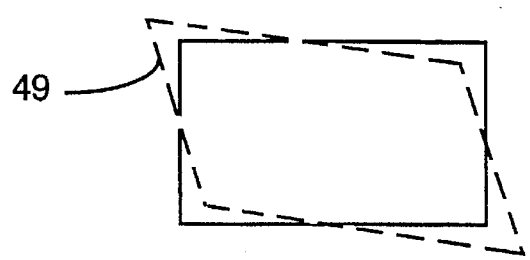

In each of the embodiments discussed until this point, plate 28 has only been said to be bendable to correct the magnification factor of the optical system in the direction normal to the bending axis of the plate. In addition, an optical system may have an inherent skew distortion problem. Correcting that problem in an optical system of any type can be accomplished by twisting a thin glass plate located in the optical path of the system. FIG. 9a illustrates a flat glass plate 28, like those discussed previously, in a twisted configuration (exaggerated here for illustration purposes), and FIG. 9b illustrates the effect of that twisting on a rectangular image having passed through plate 28 twisted in the way shown.

Figure 10B:
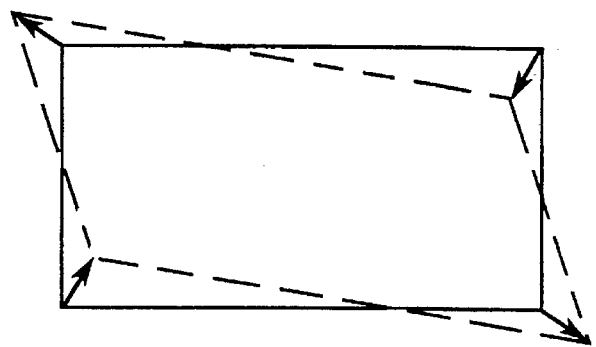
FIG. 10b is a representation of a rectangular image having passed through the plate of FIG. 10a without and with said plate having been twisted.
Figure 10A:
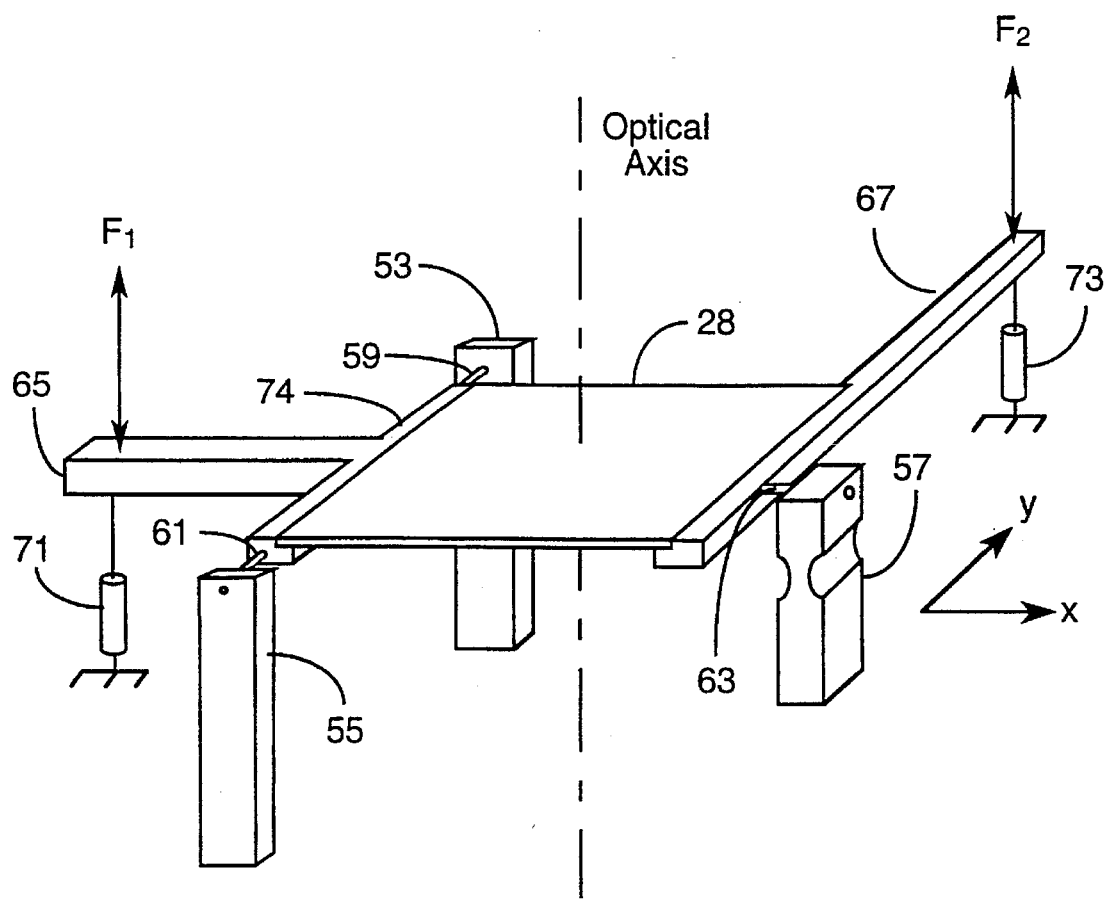
FIG. 10a is a perspective view of a representative mounting system for introducing with independent actuators a magnification and skew distortion with a single plate of the present invention, with that mounting system permitting bending, twisting, or a combination of the two of the plate so as to produce magnification along one axis in the image and a skew distortion.

FIG. 10a illustrates a mounting and actuation system that enables bending along an axis in one direction (X-axis in FIG. 10a), and twisting around an axis normal to the bending axis (Y-axis in FIG. 10a), of a glass plate included in an optical system to effect the corresponding corrections. Shown here is a flat glass plate 28 having attached thereto two stiff ribs 67 and 74 running along two parallel opposed edges of plate 28, with plate 28 mounted normal to the axis of the optical system.

Glass plate 28, with ribs 67 and 74 affixed thereto, is mounted in a three point mounting configuration having supports 53, 55 and 57 which are mounted at fixed points in the optical system. The first edge rib 74 is constrained by a pivot axis fixed with respect to the optical system and parallel to the desired bending axis of plate 28. This is shown in FIG. 10a with pins 59 and 61 being longitudinally oriented parallel to the overall length of rib 74 and each of pins 59 and 61 are mounted rotationally free in supports 53 and 55, respectively. The second edge rib 67 is constrained by a swivel connection in the direction perpendicular to the optic axis and ribs 67 and 74. This is shown in FIG. 10a with pin 63 being perpendicularly oriented to the axis of rib 67 and rotationally mounted in support 57.

To apply a bending torque to plate 28, a lever 65 is attached to rib 74 and extends perpendicularly away from the rotational axis of rib 74 between supports 53 and 55. To actuate the application of the bending torque to plate 28, a force transducer 71 is connected to lever 65 to generate force $F_1$ in either direction to bend plate 28 concavely or convexly. To enable the application of a twisting torque to plate 28, rib 67 extends longitudinally beyond plate 28 in one direction. To actuate the application of the twisting torque to plate 28, a force transducer 73 is connected to an extension of rib 67 at a point spaced away from pin 63 to generate force $F_2$ in either direction to twist plate 28. Each of force transducers 71 and 73 can be implemented with several commercially available transducers of which a voice coil is one example. Thus it can be seen that with this example mounting configuration, independent twisting and bending actions can each be simultaneously applied to a glass plate 28.

Further, if a second such assembly could be included and rotated 90° about the optical axis relative to the first such assembly shown in FIG. 10a, the bending of the second plate 28 will cause magnification changes in the image plane that are rotated 90° about the optical axis relative to the magnification changes caused by the bending of the first plate 28, and the twisting of the second plate 28 will have the opposite effect caused by the twisting of the first plate 28. Thus, unless additional distortion correction beyond what can be obtained from a single assembly as in FIG. 10a, the second assembly could simply be one wherein only bending of a second plate can occur.

In an actual implementation, force transducers 71 and 72 could be implemented in various ways where they are either manually or automatically adjusted, perhaps by a computerized control system that is being used to exercise a complete system of which the optical system discussed here is only a part. Further, given the configuration of the optical system with which a designer may choose to incorporate any of the features of the present invention, the optimum means for mounting and manipulation of plate 28 will be readily apparent.

FIG. 10b illustrates the effect on a rectangular image before (solid line) passing through a twisted plate, and the skewed image (broken lines) after having passed through the twisted plate. Note, that in both the skewed format the opposite sides of the image remain parallel to each other. It should also be noted that if the image transmitted through plate 28 is the skewed image indicated by the broken lines in FIG. 10b, plate 28 can be twisted to place the image into the rectangular shape illustrated by the solid lines in FIG. 10b.

A third feature of the present invention is illustrated in the schematic representation of FIG. 7. The optical system that is shown here is substantially the same as that shown in FIG. 6 with magnification adjustment plates $28_1$ and $28_2$ left out for clarity. In addition, FIG. 7 also illustrates more completely the path of the incident light that illuminates reticle 2. Namely, light from the illumination source (not shown) passes through a second plano lens 44, and is then directed via a flat mirror 42 to reticle 2.

Additionally, in this view, block 32 of FIG. 6 has been replaced with block 32' that has an internal beamsplitter surface 34. Thus, block 32' could be built by using two fold prisms back to back with a thin beamsplitter coating between the included faces of those prisms. Ideally beamsplitter 34 has a dichroic surface with maximum transmission of exposure radiation wavelengths and sufficient reflectivity at the alignment wavelengths. Thus, in this configuration the light that passes through reticle 2 passes through beamsplitter 34 and through the balance of the optical system as discussed with respect to FIG. 2. The difference here is that a portion of the light reflected from the surface of wafer 4 that comes back through the lens system in the reverse direction is reflected by beamsplitter 34 to face 38. An image of the surface pattern of wafer 4 is therefore formed at image plane 51 corresponding to the patterned reticle surface. Additionally, an image of the pattern on reticle 2 is also reflected back to image plane 51.

Thus, an alignment microscope 40 can be placed adjacent to conjugate image plane 51 to view the superimposed images of the patterns of reticle 2 and wafer 4. With an image of both patterns being provided continuously at conjugate image plane 51, the alignment of the two patterns can be checked with alignment microscope 40 placed adjacent to conjugate image plane 51. This permits the alignment to be checked between the two patterns at any time, or continuously, without interfering in the overall operation of the stepper system. Further, illumination could be provided to wafer 4 via a beamsplitter situated in the optical path of microscope 40 for the alignment process. Reticle 2 then is illuminated in the usual way and wafer 4 is illuminated via the optical path of microscope 40. Thus, the reticle alignment keys and wafer alignment targets can be viewed separately or concurrently depending on which illumination combination is used.

While the various aspects of the present invention have been described, it is contemplated that persons skilled in the art, upon reading the preceding descriptions and studying the drawings, will realize various alternative approaches to the implementation of the various aspects of the present invention. It is therefore intended that the following appended claims be interpreted as including all such alterations and modifications that fall within the spirit and scope to the present invention and the appended claims.

What is claimed is:

1. An optical system to project an image beam from an illuminated object at an object plane to an image plane as a projected image having a selected magnification as compared to said object with said optical system defining an optical path between said object and image planes, said optical system comprising:

a lens system, having a fixed magnification, mounted in said optical path disposed to receive illumination from said object to produce an image thereof onto said image plane;

a first plate of a selected thickness and material that is optically compatible with said lens system disposed to apply a first variable magnification to said image beam passing therethrough, one point of said first plate fixedly mounted to constrain said first plate in said optical path; and a first actuator coupled to said first plate to selectively bend said first plate and to cause said first variable magnification in proportion to the degree of deformation of said first plate;

wherein said first variable magnification of said first plate varies said selected magnification positively or negatively in said projected image in a direction normal to an axis around which said first plate is bent, said first projected image is formed with a combination of said lens system and said first plate by applying said selected magnification to said image beam, and the product of said fixed magnification of said lens system and said first variable magnification of said first plate is equal to said selected magnification.

2. An optical system as in claim 1 further including:

a second plate of a selected thickness and material that is optically compatible with said lens system disposed to apply a second variable magnification to said image beam passing therethrough, one point of said second plate fixedly mounted to constrain said second plate in said optical path; and a second actuator coupled to said second plate to selectively bend said second plate and to thereby cause said second variable magnification in proportion to the degree of deformation of said second plate;

wherein said second variable magnification of said second plate varies said selected magnification positively or negatively in said projected image in a direction normal to an axis around which said second plate is bent, said selected magnification is the result of the cumulative effect of said fixed magnification of said lens system and each of said first and second flat plates with the variation of said first and second selected magnifications being independent, each in the direction corresponding to the normal to the axis around which each of said first and second plates is bent.

3. An optical system as in claim 2 wherein each of said first and second plates are independently mounted with said axes around which each plate is bent oriented orthogonally with respect to each other when each is projected to said image plane.

4. An optical system as in claim 1 wherein said projected image also has a selected skew distortion as compared to said object wherein said lens system has a fixed skew distortion, said optical system further including:

a second plate of a selected thickness and material that is optically compatible with said lens system disposed to apply a first variable skew distortion to said image beam passing therethrough, one point of said second plate fixedly mounted to constrain said second plate in said optical path; and a second actuator coupled to said second plate to selectively twist said second plate and to cause said first variable skew distortion in proportion to the degree of deformation of said second plate;

wherein said first variable skew distortion of said second plate varies said selected skew distortion in a fashion where the magnification of said projected image is unchanged in the directions parallel and normal to the axis about which said second plate is twisted, and the magnification of said projected image increases in two diagonally opposed quadrants with respect to the parallel and normal directions and decreases in the other two diagonally opposed quadrants in proportion to the amount of twisting of said second plate, said projected image is formed with a combination of said lens system and said second plate by applying said selected skew distortion to said image beam, and said skew distortion is the sum of said fixed distortion of said lens system and said selected skew distortion of said second plate.

5. An optical system as in claim 4 wherein each of said first and second plates are independently mounted.

6. An optical system as in claim 1 wherein:

said lens system is a Wynne Dyson type optical projection system including:

a plano lens having a planar surface and a convex surface;

a meniscus lens having a concave surface and a convex surface with said convex surface of said plano lens juxtaposed with said concave surface of said meniscus lens;

a concave spherical mirror spaced apart from said convex surface of said meniscus lens;

a first fold prism having a first, a second and a third flat surface with said first flat surface juxtaposed with a portion of said flat surface of said plano lens and said second flat surface adjacent to said object plane to receive said image beam from the object, said image beam being transmitted between said first and second flat surfaces by reflection from said third flat surface; and a second fold prism having fourth, fifth and sixth flat surfaces with said fourth flat surface juxtaposed with a portion of said flat surface of said plano lens and said fifth flat surface adjacent to said image plane to receive said projected image of the object from said image beam transmitted between said fourth and fifth flat surfaces by reflection from said sixth flat surface; and said first plate is located between one of said object plane and said second flat surface of said first fold prism, and said image plane and said fifth flat face of said second fold prism.

7. An optical system as in claim 2 wherein:

said lens system is a Wynne Dyson type optical projection system including:

a plano lens having a planar surface and a convex surface;

a meniscus lens having a concave surface and a convex surface with said convex surface of said plano lens juxtaposed with said concave surface of said meniscus lens;

a concave spherical mirror spaced apart from said convex surface of said meniscus lens;

a first fold prism having a first, a second and a third flat surface with said first flat surface juxtaposed with a portion of said flat surface of said plano lens and said second flat surface adjacent to said object plane to receive said image beam from the object, said image beam being transmitted between said first and second flat surfaces by reflection from said third surface; and a second fold prism having fourth, fifth and sixth flat surfaces with said fourth flat surface juxtaposed with a portion of said flat surface of said plano lens and said fifth flat surface adjacent to said image plane to receive said projected image of said object from said image beam transmitted between said fourth and fifth flat surfaces by reflection from said sixth surface; and said first plate is located between said object plane and said second flat surface of said first fold prism; and said second plate is located between said image plane and said fifth flat face of said second fold prism.

8. An optical system as in claim 7 wherein:

said projected image is formed as a result of said image beam passing through a combination of said lens system and said first and second plates;

said first variable magnification of said first plate varies said selected magnification positively or negatively in said projected image in a direction normal to an axis around which said first plate is bent;

said second variable magnification of said second plate varies said selected magnification positively or negatively in said projected image in a direction normal to an axis around which said second plate is bent;

said selected magnification is the result of the cumulative effect of said fixed magnification of said lens system and each of said first and second flat plates; and said first and second actuators permit bending of said first and second flat plates, and thus variation of said first and second selected magnifications, independently in the directions corresponding to normals to the axes around which each of said first and second plates is bent.

9. An optical system as in claim 8 wherein each of said first and second plates are independently mounted with said axes around which each plate is bent oriented orthogonally with respect to each other when each is projected to said image plane.

10. An optical system as in claim 4 wherein:

said lens system is a Wynne Dyson type optical projection system including:

a plano lens having a planar surface and a convex surface;

a meniscus lens having a concave surface and a convex surface with said convex surface of said plano lens juxtaposed with said concave surface of said meniscus lens;

a concave spherical mirror spaced apart from said convex surface of said meniscus lens;

a first fold prism having a first, a second and a third flat surface with said first flat surface juxtaposed with a portion of said flat surface of said plano lens and said second flat surface adjacent to said object plane to receive said image beam from the object, said image beam being transmitted between said first and second flat surfaces by reflection from said third surface; and a second fold prism having a fourth, a fifth and a sixth flat surface with said fourth flat surface juxtaposed with a portion of said flat surface of said plano lens and said fifth flat surface adjacent to said image plane to receive said projected image of said object from said image beam transmitted between said fourth and fifth flat surfaces by reflection from said sixth surface; and one of said first and second plates is located between said object plane and said second flat surface of said first fold prism; and the other one of said first and second plates is located between said image plane and said fifth flat face of said second fold prism.

11. An optical system as in claim 1 wherein:

said lens system is a Wynne Dyson type optical projection system including:

a plano lens having a planar surface and a convex surface;

a meniscus lens having a concave surface and a convex surface with said convex surface of said plano lens juxtaposed with said concave surface of said meniscus lens;

a concave spherical mirror spaced apart from said convex surface of said meniscus lens;

an optical block having a first and a second flat surface substantially parallel to each other with said first flat surface juxtaposed with a portion of said flat surface of said plano lens and said second flat surface adjacent to said object plane to receive said image beam from the object, said image beam being transmitted directly between said first and second flat surfaces; and a fold prism having a first, a second and a third flat surface with said first flat surface juxtaposed with a portion of said flat surface of said plano lens and said second flat surface adjacent to said image plane to receive said projected image of the object from said image beam transmitted between said first and second flat surfaces by reflection from said third surface; and said first plate is located between one of said object plane and said second flat surface of said optical block, and said image plane and said second flat face of said fold prism.

12. An optical system as in claim 2 wherein:

said lens system is a Wynne Dyson type optical projection system including:

a plano lens having a planar surface and a convex surface;

a meniscus lens having a concave surface and a convex surface with said convex surface of said plano lens juxtaposed with said concave surface of said meniscus lens;

a concave spherical mirror spaced apart from said convex surface of said meniscus lens;

an optical block having a first and a second flat surface substantially parallel to each other with said first flat surface juxtaposed with a portion of said flat surface of said plano lens and said second flat surface adjacent to said object plane to receive said image beam from the object, said image beam being transmitted directly between said first and second flat surfaces; and a fold prism having a first, a second and a third flat surface with said first flat surface juxtaposed with a portion of said flat surface of said plano lens and said second flat surface adjacent to said image plane to receive said projected image of the object from said image beam transmitted between said first and second flat surfaces by reflection from said third surface; and said first plate is located between said object plane and said second flat surface of said optical block; and said second plate is located between said image plane and said second flat face of said fold prism.

13. An optical system as in claim 4 wherein:

said lens system is a Wynne Dyson type optical projection system including:

a plano lens having a planar surface and a convex surface;

a meniscus lens having a concave surface and a convex surface with said convex surface of said plano lens juxtaposed with said concave surface of said meniscus lens;

a concave spherical mirror spaced apart from said convex surface of said meniscus lens;

an optical block having a first and a second flat surface substantially parallel to each other with said first flat surface juxtaposed with a portion of said flat surface of said plano lens and said second flat surface adjacent to said object plane to receive said image beam from the object, said image beam being transmitted directly between said first and second flat surfaces; and a fold prism having a first, a second and a third flat surface with said first flat surface juxtaposed with a portion of said flat surface of said plano lens and said second flat surface adjacent to said image plane to receive said projected image of the object from said image beam transmitted between said first and second flat surfaces by reflection from said third surface; and said first plate is located between said object plane and said second flat surface of said optical block; and said second plate is located between said image plane and said second flat face of said fold prism.

14. An optical system to project an image beam from an illuminated object at an object plane to an image plane as a projected image having a selected skew distortion as compared to said object with said optical system defining an optical path between said object and image planes, said optical system comprising:

a lens system, having a fixed skew distortion, mounted in said optical path disposed to receive illumination from said object to produce an image thereof onto said image plane;

a first plate of a selected thickness and material that is optically compatible with said lens system disposed to apply a first variable skew distortion to said image beam passing therethrough, one point of said first plate fixedly mounted to constrain said first plate in said optical path; and a first actuator coupled to said first plate to selectively twists said first plate and to cause said first variable skew distortion in proportion to the degree of deformation of said first plate;

wherein said first variable skew distortion of said first plate varies said selected skew distortion in a fashion where the magnification of said projected image is unchanged in the directions parallel and normal to the axis about which said first plate is twisted, and the magnification of said projected image increases in the two diagonally opposed quadrants with respect to the parallel and normal directions and decreases in the other two diagonally opposed quadrants in proportion to the amount of twisting of said first plate, said first projected image is formed with a combination of said lens system and said first plate by applying said selected skew distortion to said image beam, and said skew distortion is the sum of said fixed distortion of said lens system and said selected skew distortion of said first plate.

15. An optical system as in claim 14 further including:

a second plate of a selected thickness and material that is optically compatible with said lens system disposed to apply a second variable skew distortion to said image beam passing therethrough, one point of said second plate fixedly mounted to constrain said second plate in said optical path; and a second actuator coupled to said second plate to selectively twist said second plate and to cause said second variable skew distortion in proportion to the degree of deformation of said second plate;

wherein said second variable skew distortion of said second plate varies said selected skew distortion in a fashion where the magnification of said projected image is unchanged in the directions parallel and normal to the axis about which said second plate is twisted, and the magnification of said projected image increases in the two diagonally opposed quadrants with respect to the parallel and normal directions and decreases in the other two diagonally opposed quadrants in proportion to the amount of twisting of said second plate, said projected image is formed with a combination of said lens system and said second plate by applying said selected skew distortion to said image beam, and said skew distortion is the sum of said fixed distortion of said lens system and said selected skew distortion of said second plate.

16. An optical system as in claim 15 wherein each of said first and second plates are independently mounted with said axes around which each plate is twisted oriented orthogonally with respect to each other when each is projected to said image plane.

17. An optical system as in claim 14 wherein:

said lens system is a Wynne Dyson type optical projection system including:
a plano lens having a planar surface and a convex surface;
a meniscus lens having a concave surface and a convex surface with said convex surface of said plano lens juxtaposed with said concave surface of said meniscus lens;
a concave spherical mirror spaced apart from said convex surface of said meniscus lens;
a first fold prism having first, second and third flat surfaces with said first flat surface juxtaposed with a portion of said flat surface of said plano lens and said second flat surface adjacent to said object plane to receive said image beam from the object, said image beam being transmitted between said first and second flat surfaces by reflection from said third flat surface; and
a second fold prism having fourth, fifth and sixth flat surfaces with said fourth flat surface juxtaposed with a portion of said flat surface of said plano lens and said fifth flat surface adjacent to said image plane to receive said projected image of the object from said image beam transmitted between said fourth and fifth flat surfaces by reflection from said sixth flat surface; and said first plate is located between one of said object plane and said second flat surface of said first fold prism, and said image plane and said fifth flat face of said second fold prism.

18. An optical system as in claim 15 wherein:

said lens system is a Wynne Dyson type optical projection system including:
a plano lens having a planar surface and a convex surface;
a meniscus lens having a concave surface and a convex surface with said convex surface of said plano lens juxtaposed with said concave surface of said meniscus lens;
a concave spherical mirror spaced apart from said convex surface of said meniscus lens;
a first fold prism having first, second and third flat surfaces with said first flat surface juxtaposed with a portion of said flat surface of said plano lens and said second flat surface adjacent to said object plane to receive said image beam from the object, said image beam being transmitted between said first and second flat surfaces by reflection from said third surface; and
a second fold prism having fourth, fifth and sixth flat surfaces with said fourth flat surface juxtaposed with a portion of said flat surface of said plano lens and said fifth flat surface adjacent to said image plane to receive said projected image of said object from said image beam transmitted between said fourth and fifth flat surfaces by reflection from said sixth surface; and said first plate is located between said object plane and said second flat surface of said first fold prism; and said second plate is located between said image plane and said fifth flat face of said second fold prism.

19. An optical system as in claim 14 wherein:

said lens system is a Wynne Dyson type optical projection system including:
- a plano lens having a planar surface and a convex surface;
- a meniscus lens having a concave surface and a convex surface with said convex surface of said plano lens juxtaposed with said concave surface of said meniscus lens;
- a concave spherical mirror spaced apart from said convex surface of said meniscus lens;
- an optical block having first and second flat surfaces substantially parallel to each other with said first flat surface juxtaposed with a portion of said flat surface of said plano lens and said second flat surface adjacent to said object plane to receive said image beam from the object, said image beam being transmitted directly between said first and second flat surfaces; and
- a fold prism having first, second and third flat surfaces with said first flat surface juxtaposed with a portion of said flat surface of said plano lens and said second flat surface adjacent to said image plane to receive said projected image of the object from said image beam transmitted between said first and second flat surfaces by reflection from said third surface; and said first plate is located between one of said object plane and said second flat surface of said optical block, and said image plane and said second flat face of said fold prism.

20. An optical system as in claim 15 wherein:

said lens system is a Wynne Dyson type optical projection system including:
- a plano lens having a planar surface and a convex surface;
- a meniscus lens having a concave surface and a convex surface with said convex surface of said plano lens juxtaposed with said concave surface of said meniscus lens;
- a concave spherical mirror spaced apart from said convex surface of said meniscus lens;
- an optical block having first and second flat surfaces substantially parallel to each other with said first flat surface juxtaposed with a portion of said flat surface of said plano lens and said second flat surface adjacent to said object plane to receive said image beam from the object, said image beam being transmitted directly between said first and second flat surfaces; and
- a fold prism having first, second and third flat surfaces with said first flat surface juxtaposed with a portion of said flat surface of said plano lens and said second flat surface adjacent to said image plane to receive said projected image of the object from said image beam transmitted between said first and second flat surfaces by reflection from said third surface; and said first plate is located between said object plane and said second flat surface of said optical block; and said second plate is located between said image plane and said second flat face of said fold prism.

21. An optical system to project an image beam from an illuminated object at an object plane to an image plane as a projected image having a selected magnification and skew distortion as compared to said object with said optical system defining an optical path between said object and image planes, said optical system comprising:
- a lens system, having a fixed magnification and skew distortion mounted in said optical path disposed to receive illumination from said object to produce an image thereof onto said image plane;
- first, second and third fixed points relative to said lens system in said optical path;
- a first plate of a selected thickness and material having parallel top and bottom surfaces defining two parallel opposed edges thereof, said first plate being optically compatible with said lens system and disposed to apply at least one of a first variable magnification and first variable skew distortion to said image beam passing therethrough with said first plate being normal to the optical axis of the optical system; and
- a first actuator coupled to said first plate disposed to selectively bend and twist said first plate and to cause said at least one first variable magnification and first variable skew distortion in proportion to the degree and type of deformation of said first plate, said first actuator includes:
  - a first stiff rib of a selected axial length defining two ends at opposite ends thereof and an axis of rotation therebetween, said first stiff rib coupled to and running along one of said two parallel opposed edges of said first plate, and said two ends of said first stiff rib each swivelly constrained between said first and second fixed points to permit bending of said first plate along a bending axis that is parallel to said axis of rotation of said first stiff rib;
  - a first lever arm affixed to said first stiff rib that extends away from the longitudinal axis of said first stiff rib and said first plate;
  - a second stiff rib of a selected axial length coupled to and running along the second of said two parallel opposed edges of said first plate, and said second stiff rib swivelly constrained to said third fixed point perpendicular to said axial length thereof to permit twisting of said first plate along an axis that is perpendicular to said axis of rotation of said first stiff rib;
  - a second lever arm affixed to said second stiff rib that extends away from said second plate in a direction parallel to said two parallel opposed edges of said first plate;
  - a first controller coupled to said first lever arm to selectively cause rotation about said longitudinal axis of said first stiff rib between said first and second fixed points with said first plate also rotating about said third fixed point in response thereto as necessary; and
  - a second controller coupled to said second lever arm to selectively cause rotation of said second stiff rib about said third fixed point with said first plate also rotating about said first and second fixed points in response thereto as necessary;
- wherein said selective bending and twisting of said first plate varies the first magnification and first skew distortion of said first plate either positively or negatively in said projected image with the magnification and skew distortion in said projected image being a combination of the fixed magnification and skew image of said lens system and said selected first magnification and first skew distortion of said first plate.

22. An optical system as in claim 21 wherein said system further includes:

fourth, fifth and sixth fixed points relative to said lens system in said optical path;

a second plate of a selected thickness and material having parallel top and bottom surfaces defining two parallel opposed edges thereof, said second plate being optically compatible with said lens system and disposed to apply at least one of a second variable magnification and second variable skew distortion to said image beam passing therethrough with said second plate being normal to the optical axis of the optical system; and a second actuator coupled to said second plate disposed to selectively bend and twist said second plate and to cause said at least one second variable magnification and second variable skew distortion in proportion to the degree of deformation of said second plate, said second actuator includes:

a third stiff rib of a selected axial length defining two ends at opposite ends thereof and an axis of rotation therebetween, said third stiff rib coupled to and running along one of said two parallel opposed edges of said second plate, and said two ends of said second stiff rib each swivelly constrained between said fourth and fifth fixed points to permit bending of said second plate along a bending axis that is parallel to said axis of rotation of said third stiff rib;

a third lever arm affixed to said third stiff rib that extends away from the longitudinal axis of said third stiff rib and said second plate;

a fourth stiff rib of a selected axial length coupled to and running along the second of said two parallel opposed edges of said second plate, and said fourth stiff rib swivelly constrained to said sixth fixed point perpendicular to said axial length thereof to permit twisting of said second plate along an axis that is perpendicular to said axis of rotation of said third stiff rib;

a third lever arm affixed to said third stiff rib that extends away from said second plate in a direction parallel to said two parallel opposed edges of said second plate;

a third controller coupled to said third lever arm to selectively cause rotation about said longitudinal axis of said third stiff rib between said fourth and fifth fixed points with said second plate also rotating about said sixth fixed point in response thereto as necessary; and a fourth controller coupled to said fourth lever arm to selectively cause rotation of said fourth stiff rib about said sixth fixed point with said second plate also rotating about said fourth and fifth fixed points in response thereto as necessary;

wherein said selective bending and twisting of said second plate varies the magnification and skew distortion of said second plate either positively or negatively in said projected image with the magnification and skew distortion in said projected image being a combination of the fixed magnification and skew image of said lens system and said selected first magnification and first skew distortion of said first plate and said selected second magnification and second skew distortion of said second plate.

23. An optical system as in claim 22 wherein each of said first and second plates are independently mounted with said axes around which each plate is bent oriented orthogonally with respect to each other when each is projected to said image plane.

24. A Wynne Dyson type optical system to project an image beam from an illuminated object at an object plane to an image plane onto a substrate as a projected image, said projected image having substantially a 1:1 magnification as compared to said object with said optical system defining an optical path between said object and image planes, and said substrate at said image plane may have a pre-formed pattern thereon, said optical system comprising:

a plano lens having a planar surface and a convex surface;

a meniscus lens having a concave surface and a convex surface with said convex surface of said plano lens juxtaposed with said concave surface of said meniscus lens;

a concave spherical mirror spaced apart from said convex surface of said meniscus lens;

an optical block having first and second flat surfaces substantially parallel to each other with said first flat surface juxtaposed with a portion of said flat surface of said plano lens and said second flat surface adjacent to said object plane to receive said image beam from the object, said image beam being transmitted directly between said first and second flat surfaces; and a fold prism having first and second flat surfaces with said first flat surface juxtaposed with a portion of said flat surface of said plano lens and said second flat surface adjacent to said image plane to receive said projected image of the object from a transmitted image between said first and second flat surfaces by reflection from a third surface.

25. A Wynne Dyson type optical system as in claim 24 wherein said optical block contains a beam splitting surface extending diagonally between said first and second flat surfaces and a third flat surface extending between and defining an edge of each of said first and second flat surfaces of said optical block, said beam splitting surface having a dichroic coating selected to present minimal attenuation to exposure illumination and to reflect a selected portion of light incident thereon to said third flat surface of said optical block, said light reflected to said third surface of said optical block including light of a selected portion of the spectrum used for alignment.

26. A Wynne Dyson type optical system as in claim 25 wherein said system further includes a microscope adjacent to said third flat surface of said optical block to enable a user of said system to view an image formed by light reflected thereto from said beam splitting surface.

27. A Wynne Dyson type optical system as in claim 26 wherein said system further includes a light source adjacent to said third flat surface of said optical block to project light through said third flat surface that is reflected by said beam splitting surface and transmitted to said image plane to permit a user to view said pre-formed pattern on said substrate located at said image plane by viewing light reflected back therefrom through said optical system.

28. A Wynne Dyson type optical system as in claim 26 wherein said microscope can be used to view the superposition of said projected image and said pre-formed pattern at said image plane when illumination from said object adjacent to said second flat surface of said optical block is transmitted to said image plane by light reflected therefrom.

\* \* \* \* \*